United States Patent
Wang et al.

(10) Patent No.: US 11,808,633 B2
(45) Date of Patent: Nov. 7, 2023

(54) INFRARED THERMOPILE SENSOR

(71) Applicant: ORIENTAL SYSTEM TECHNOLOGY INC., Hsin-Chu (TW)

(72) Inventors: Chein-Hsun Wang, Hsin-Chu (TW); Da-Jun Lin, Kaohsiung (TW); Chun-Chiang Chen, Hsin-Chu County (TW); Chih-Yung Tsai, Taichung (TW); Yu-Chih Liang, Hsinchu (TW); Ming Le, New Taipei (TW); Chen-Tang Huang, Hsinchu County (TW); Tung-Yang Lee, Hsinchu County (TW); Jenping Ku, Hsinchu County (TW)

(73) Assignee: ORIENTAL SYSTEM TECHNOLOGY INC., Hsin-Chu (TW)

( * ) Notice: Subject to any disclaimer, the term of this patent is extended or adjusted under 35 U.S.C. 154(b) by 243 days.

(21) Appl. No.: 17/403,117

(22) Filed: Aug. 16, 2021

(65) Prior Publication Data
US 2023/0047601 A1 Feb. 16, 2023

(51) Int. Cl.
*G01J 5/00* (2022.01)
*G01J 5/14* (2006.01)
(Continued)

(52) U.S. Cl.
CPC ............... *G01J 5/14* (2013.01); *G01J 5/025* (2013.01); *G01J 5/045* (2013.01); *G01K 7/028* (2013.01); *G01K 7/06* (2013.01); *H10N 10/817* (2023.02)

(58) Field of Classification Search
CPC .... G01J 5/14; G01J 5/025; G01J 7/028; G01J 7/06; G01J 5/045; G01J 5/70; G01J 5/12;
(Continued)

(56) References Cited

U.S. PATENT DOCUMENTS

2006/0262829 A1* 11/2006 Manlove ................ G01J 5/16
 374/120
2010/0213373 A1* 8/2010 Meinel ................. H01L 31/02
 438/69
(Continued)

FOREIGN PATENT DOCUMENTS

CN 102889933 B * 9/2014
CN 111174923 A * 5/2020
(Continued)

OTHER PUBLICATIONS

17403117_2023-08-30_CN_102889933_B_H.pdf.*
(Continued)

*Primary Examiner* — Gail Kaplan Verbitsky
(74) *Attorney, Agent, or Firm* — Chun-Ming Shih; HDLS IPR SERVICESX

(57) ABSTRACT

An infrared thermopile sensor includes a silicon cover having an infrared lens, an infrared sensing chip having duo-thermopile sensing elements, and a microcontroller chip calculating a temperature of an object. The components are in a stacked 3D package to decrease the size of the infrared thermopile sensor. The infrared sensing chip and the microcontroller chip have metal layers to shield the thermal radiation. The conversion from wrist temperature to body core temperature uses detected ambient temperature and fixed humidity or imported humidity level to calculate the body core temperature based on experimental data and curve fitting. The skin temperature compensation can be set differently for different sex gender, different standard deviation of wrist temperature and external relative humidity reading.

19 Claims, 7 Drawing Sheets

(51) Int. Cl.
*G01J 5/02* (2022.01)
*G01K 7/06* (2006.01)
*G01K 7/02* (2021.01)
*G01J 5/04* (2006.01)
*H10N 10/817* (2023.01)

(58) Field of Classification Search
CPC ....... G01J 5/0265; H01N 10/817; G01K 7/06; G01K 7/028
USPC .......................... 374/121; 702/135; 250/338.1
See application file for complete search history.

(56) References Cited

U.S. PATENT DOCUMENTS

| | | | |
|---|---|---|---|
| 2017/0219434 A1* | 8/2017 | Udrea | H10N 19/00 |
| 2019/0285478 A1* | 9/2019 | Ali | G01J 5/14 |

FOREIGN PATENT DOCUMENTS

| | | | | | |
|---|---|---|---|---|---|
| CN | 112945398 | A | * | 6/2021 | |
| CN | 111664950 | B | * | 11/2021 | ................ G01J 5/00 |
| CN | 111579096 | B | * | 3/2022 | ................ G01J 5/12 |
| CN | 115101654 | A | * | 9/2022 | |
| EP | 1724560 | A1 | * | 11/2006 | ................ G01J 5/16 |
| JP | H0581666 | U | * | 1/1993 | |
| JP | 2012058084 | A | * | 3/2012 | |
| KR | 20150052809 | A | * | 5/2015 | |
| WO | WO-2006122529 | A2 | * | 11/2006 | ................ G01J 5/06 |
| WO | WO-2013120652 | A1 | * | 8/2013 | ................ G01J 5/023 |

OTHER PUBLICATIONS

17403117_2023-08-30_KR_20150052809_A_H.pdf.*
17403117_2023-08-30_WO_2006122529_A2_H.pdf.*
17403117_2023-08-30_WO_2013120652_A1_H.pdf.*
17403117_2023-08-30_JP_2012058084_A_H.pdf.*
17403117_2023-08-30_CN_115101654_A_H.pdf.*

* cited by examiner

INFRARED THERMOPILE SENSOR

BACKGROUND

Technical Field

The disclosure relates to a sensor, particularly relates to an infrared thermopile sensor.

Description of Related Art

The wearable temperature sensor used in hospital for early detection of patient infection is proved to be useful. Infection is an important cause of morbidity and mortality in the patients with renal failure. Early identification and treatment of infection are used to reduce mortality especially during dialysis or immunosuppression in renal transplantation and treatment of other immune-based diseases. Continuous body temperature monitoring to the patient is derived to aid in the early detection and treatment of infection. In intensive care unit (ICU), the body temperature monitoring to the patients are performed by the nurses every two to four hours in the present condition. Therefore, there is a need to develop continuous body temperature monitoring for patients.

Temperature monitoring through skin temperature is a convenient way for long term continuous monitoring of body temperature. For a wearable device, such as watch, the wrist temperature may be measured by contact type or non-contact type sensor (for example, thermopile sensor) and the readout may be transmitted to control center through wireless communication (for example, Bluetooth and Wi-fi).

The related contact type temperature sensor uses silicon devices that the readout is proportional to contact temperature. The responding speed of the contact type temperature sensor is relatively slow due to high thermal mass. For example, the contact type temperature sensor needs to be kept in a steady state for 10 minutes to get results, and the accuracy may be impacted by sweat, thermal resistance between the sensor and package, and/or the tightness of wearing, etc.

The related non-contact type thermal sensor detects infrared radiation from human body that is more accurate and faster response comparing to the contact type thermal sensor. However, the accuracy may be impacted by package radiation due to ambient temperature variation. Therefore, when the non-contact type thermal sensor is used, the ambient temperature variation effect caused by the package needs to be compensated.

Furthermore, the skin temperature and core temperature of human body are different. Different persons may have great variance in the wrist or skin temperature, and the wrist temperature is ambient temperature dependent. Therefore, the wrist temperature cannot be used to estimate body temperature directly. In general, the wrist temperature may be varied due to ambient temperature, humidity, air speed, body core temperature, clothing, gender and metabolic rate, etc.

For the user, the wrist temperature monitoring using the wearable device is more comfort and suitable for long term wearing. The disclosure here is to propose an infrared thermopile sensor that may be used in the wearable device (such as watch) and provide body core temperature information for personal health management.

SUMMARY

The objective of this disclosure is to provide an infrared thermopile sensor that may be used in the wearable device and measure body core temperature correctly.

In some embodiments of the disclosure, an infrared thermopile sensor includes an infrared sensing chip, a silicon cover, a microcontroller chip, a package substrate, and a sealing encapsulation. The infrared sensing chip includes a first substrate, a first thermopile sensing element, a second thermopile sensing element, and a front-end signal processing unit. The first substrate has a wire-bonding pad and two membrane structures configured by a front-side wet etching. The first thermopile sensing element is disposed on one of the membrane structures and generates a temperature signal. The second thermopile sensing element is disposed on another one of the membrane structures and adjacent to the first thermopile sensing element, and generates a compensation temperature signal. The front-end signal processing unit is disposed on the first substrate and electrically connected with the first thermopile sensing element and the second thermopile sensing element. The front-end signal processing unit includes an ambient temperature sensing element and a non-volatile memory. The ambient temperature sensing element generates an ambient temperature information. The non-volatile memory is configured to store the ambient temperature information. The silicon cover is bonded to the infrared sensing chip by a wafer-level bonding, and includes an infrared Fresnel lens focusing a thermal radiation of the object to the first thermopile sensing element. The size of the silicon cover is smaller than the size of the infrared sensing chip, and the wire-bonding pads on the infrared sensing chip are exposed. The microcontroller chip is connected with the infrared sensing chip, and configured to receive the temperature signal, the compensation temperature signal and the ambient temperature information, and to compute to obtain a temperature adjustment information relative to a predetermined temperature according to an air temperature and a water vapor pressure information, and to calculate a first temperature of the object according to the temperature signal, the compensation temperature signal and the temperature adjustment information. The microcontroller chip includes a second substrate, a first metal layer, and a plurality of through silicon vias (TSVs). The first metal layer is disposed on an upper surface of the second substrate and includes a metal material with low emissivity to reduce the thermal disturbance from the microcontroller chip to the infrared sensing chip. The TSVs are disposed in the second substrate. The package substrate carries the microcontroller chip, and receives an output signal or an input signal of the microcontroller chip through the TSVs, and has a plurality of contacts disposed on a lower surface thereof. The TSVs are electrically connected with the contacts. The sealing encapsulation covers the package substrate, the microcontroller chip, the infrared sensing chip, and the silicon cover. The upper surface of the silicon cover is exposed from the sealing encapsulation.

In some embodiments of the disclosure, the microcontroller chip is configured to calculate the first temperature according to the ambient temperature information after subtracting the compensation temperature signal from the temperature signal.

In some embodiments of the disclosure, the microcontroller chip is configured to calculate the first temperature according to the ambient temperature information after subtracting the compensation temperature signal multiplied with a first parameter from the temperature signal.

In some embodiments of the disclosure, the infrared sensing chip and the microcontroller chip are glued together by a die attach film (DAF).

In some embodiments of the disclosure, the first substrate has a second metal layer disposed on a lower surface thereof.

In some embodiments of the disclosure, the front-end signal processing unit further has a signal selection multiplexer and a communication interface electrically connected with the ambient temperature sensing element and the non-volatile memory.

In some embodiments of the disclosure, the ambient temperature sensing element has at least one thermal sensitive diode.

In some embodiments of the disclosure, the silicon cover has a first cavity and a second cavity corresponding to the first thermopile sensing element and the second thermopile sensing element respectively, and the silicon cover and the infrared sensing chip are bonded together by the wafer-level bonding with a eutectic bonding or a solder bonding.

In some embodiments of the disclosure, when the silicon cover and the infrared sensing chip are bonded together, the first cavity and the second cavity seal the first thermopile sensing element and the second thermopile sensing element respectively by a vacuum encapsulation.

In some embodiments of the disclosure, a depth of the first cavity is greater than or equal to about 40 μm and less than or equal to about 100 μm.

In some embodiments of the disclosure, the silicon cover has a fourth metal layer disposed on the upper surface thereof corresponding to the second thermopile sensing element.

In some embodiments of the disclosure, the metal material of the first metal layer has an aluminum.

In some embodiments of the disclosure, the infrared sensing chip is a silicon on insulator (SOI) chip, and a packaging height of the infrared thermopile sensor is less than 1 mm.

In some embodiments of the disclosure, a depth of an oxide insulating layer in the SOI chip is greater than about 2 μm.

In some embodiments of the disclosure, an offset is between the ambient temperature information generated by the ambient temperature sensing element and the air temperature of an external environment, the microcontroller chip is configured to calculate the air temperature according to the ambient temperature information and the offset.

In some embodiments of the disclosure, the microcontroller chip is configured to calculate a second temperature of the object according to the first temperature.

In some embodiments of the disclosure, the microcontroller chip is configured to convert the first temperature to the second temperature according to a conversion curve.

In some embodiments of the disclosure, the microcontroller use different conversion curves for the first temperature to the second temperature based on different standard deviations of the first temperature depending on the air temperature being calculated.

In some embodiments of the disclosure, the first temperature is a wrist temperature.

In some embodiments of the disclosure, the microcontroller chip is configured to further compute to obtain the temperature adjustment information on the predetermined temperature according to the ambient temperature information, the water vapor pressure information and a gender information.

In summary, the infrared thermopile sensor of the disclosure uses the stacked 3D package to reduce the volume, such as about 2×2×1.0 mm³. Further, the infrared thermopile sensor includes a silicon cover with a lens using to confine the viewing angle to less than 30 degrees (in some embodiments, less than 45 degrees) and an infrared sensing chip having duo-thermopile sensing elements. One of the thermopile sensing elements is the active unit for measuring the first temperature of the object, and another one of the thermopile sensing elements is the compensation unit (dummy unit) for compensating the influence of the package structure. Thus, the infrared thermopile sensor of the disclosure may accurately measure the temperature under the acute change of ambient temperature.

Furthermore, the non-contact type infrared thermopile sensor of the disclosure may be used in the wearable device (such as watch) and operated at wide ambient temperature range for wrist temperature to body core temperature conversion. By using the detected air temperature, and the wrist temperature detected from the infrared thermopile sensor, the preset or imported water vapor pressure information and gender information from watch installation, the compensated wrist temperature may be computed and used to perform nonlinear wrist temperature to body core temperature conversion.

Moreover, the standard deviations of the wrist temperature may be different from the condition of predetermined temperature (for example, 25° C.). A standard deviation correction factor may be introduced in the normalized wrist temperature to body core temperature conversion curve. That is, different wrist temperature to body core temperature conversion curve is used for various air temperature.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

Figure 1:
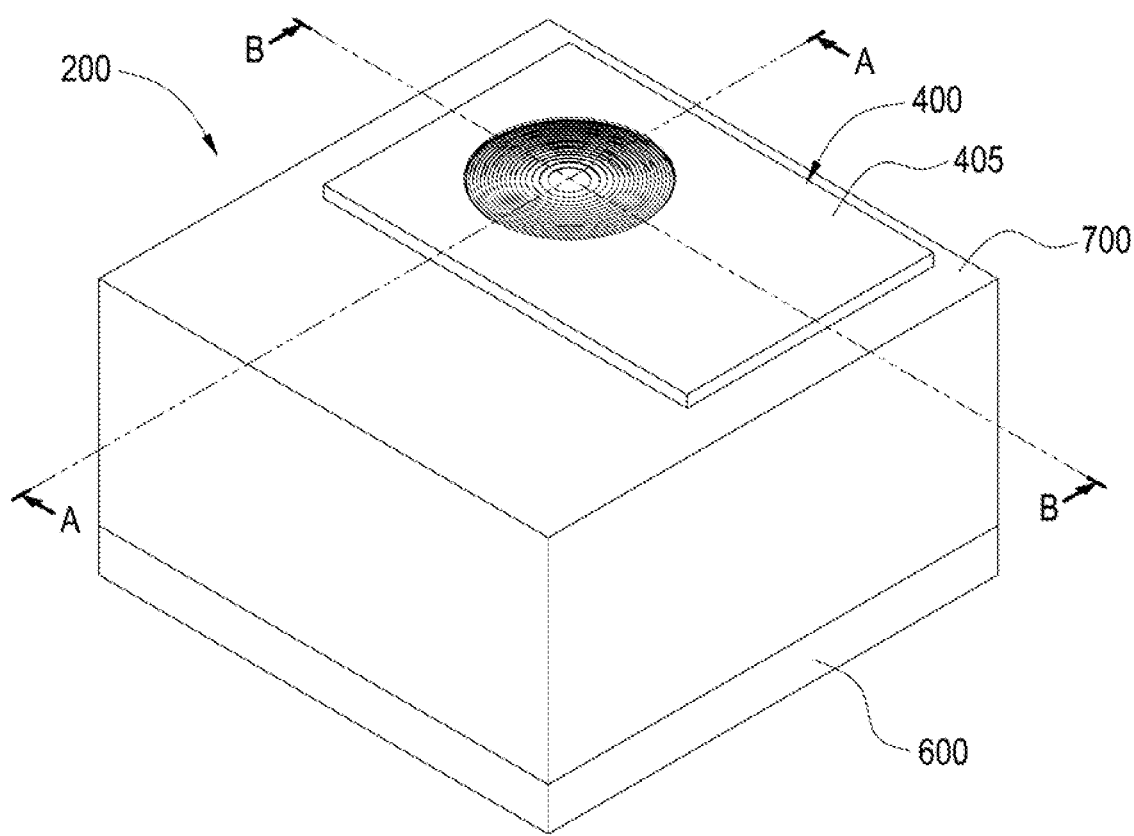
FIG. 1 is a schematic diagram of an infrared thermopile sensor, in accordance with some embodiments of the disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers, or sections, these elements, components, regions, layers, or sections are not limited by these terms. Rather, these terms are merely used to distinguish one element, component, region, layer, or section from another region, layer, or section. Thus, a first element, component, region, layer, or section discussed below could be termed a second element, component, region, layer, or section without departing from the teachings of the present inventive concept.

Figure 2:
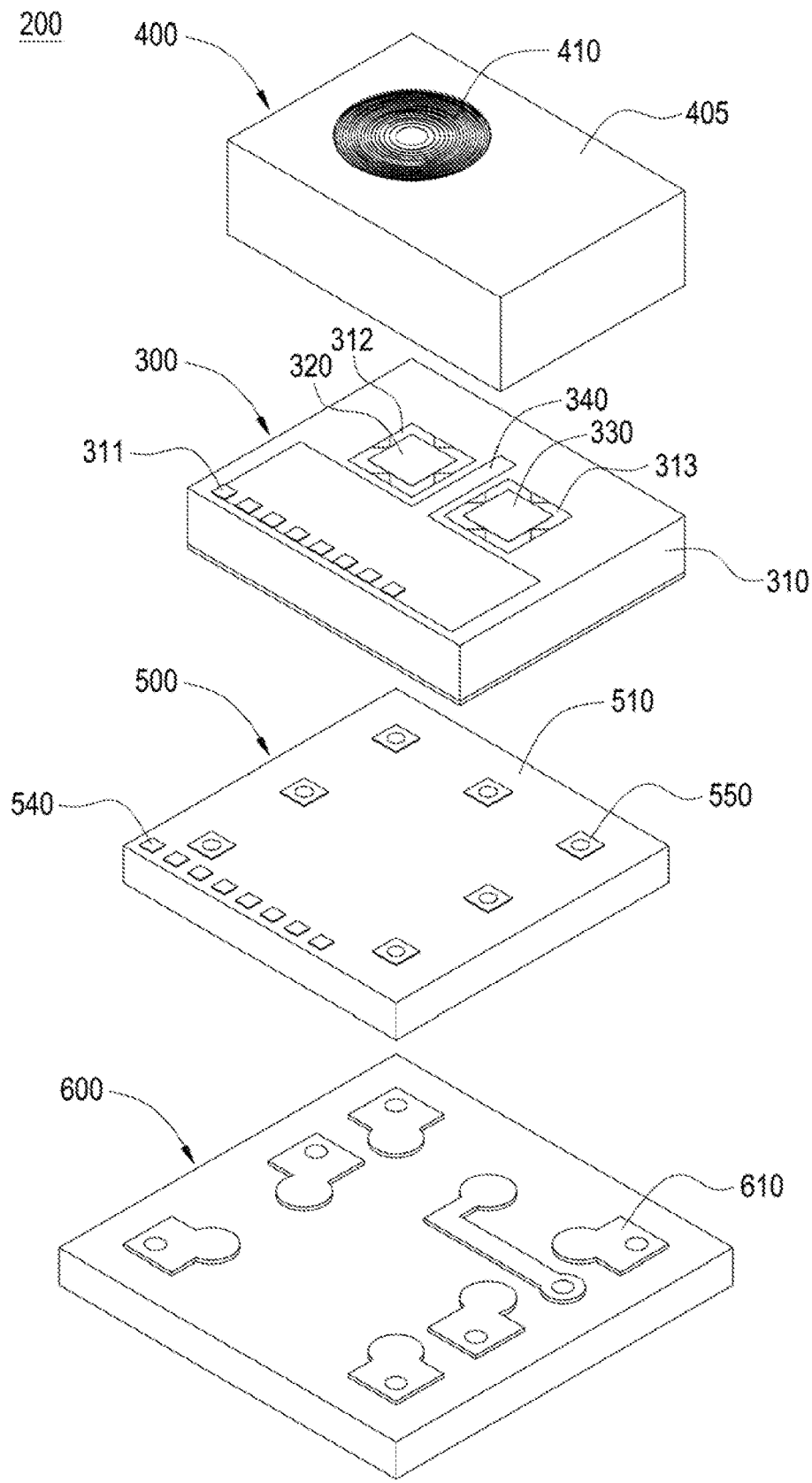
FIG. 2 is an exploded diagram of the infrared thermopile sensor, in accordance with some embodiments of the disclosure.
Figure 3A:
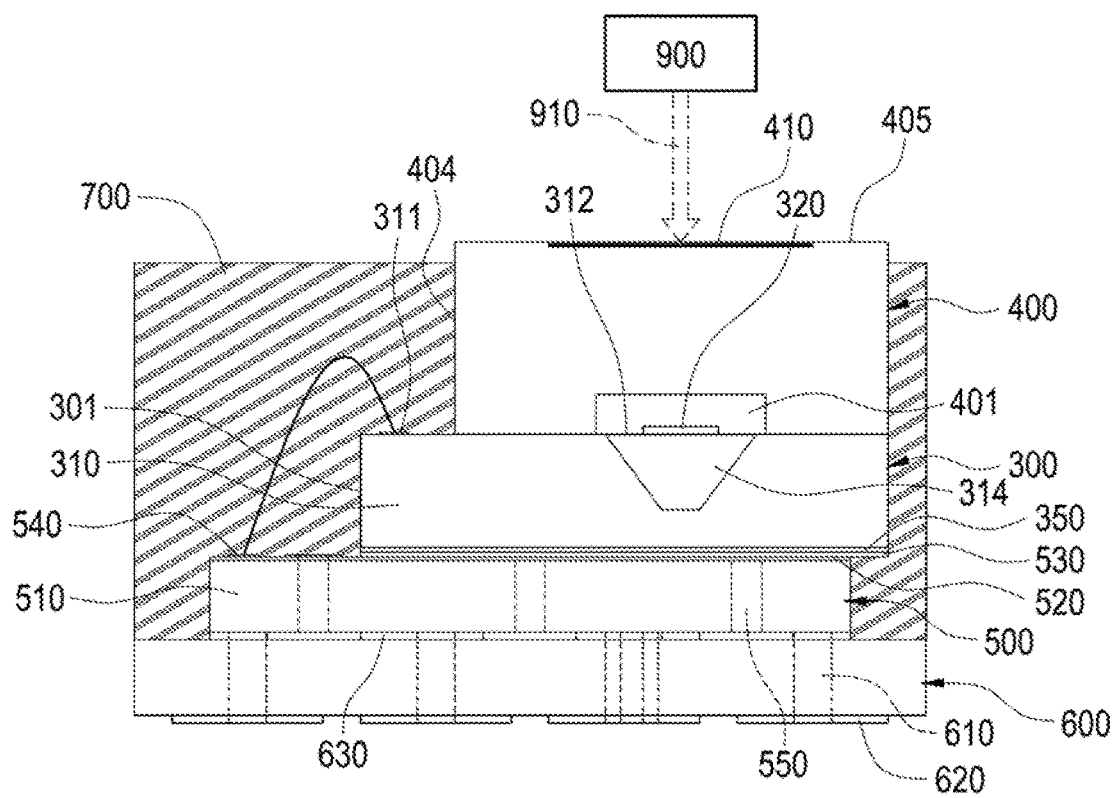
FIG. 3A is a cross-sectional diagram along the line A-A in FIG. 1.
Figure 3B:
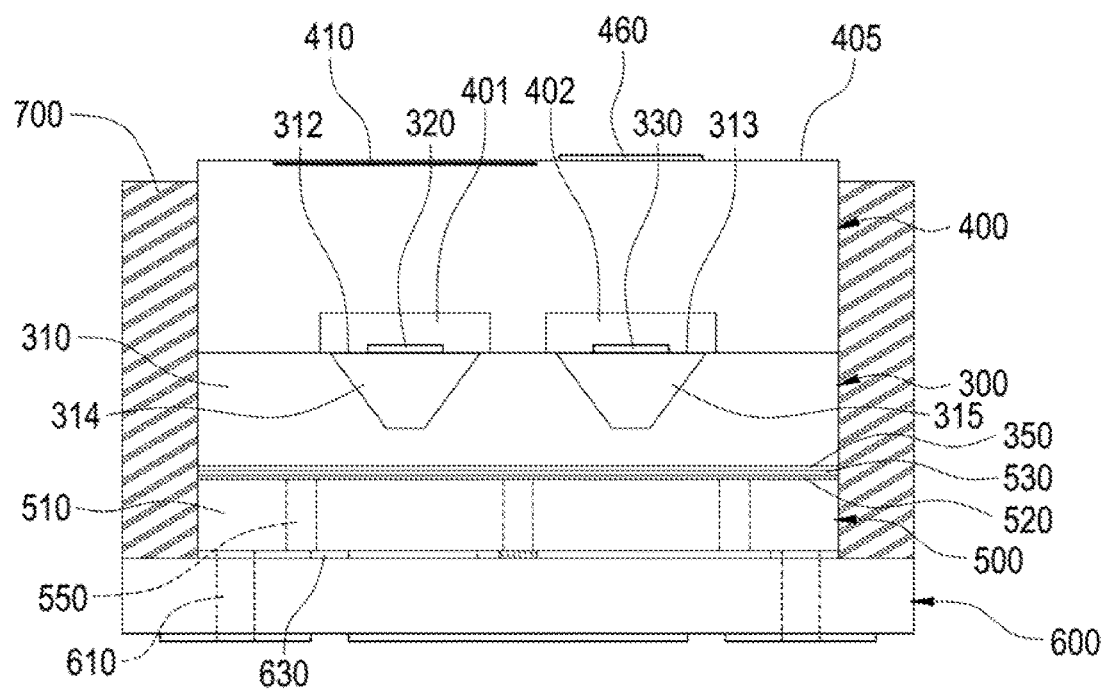
FIG. 3B is a cross-sectional diagram along the line B-B in FIG. 1.

FIG. 1 is a schematic diagram of an infrared thermopile sensor, in accordance with some embodiments of the disclosure. FIG. 2 is an exploded diagram of the infrared thermopile sensor, in accordance with some embodiments of the disclosure. FIG. 3A is a cross-sectional diagram along the line A-A in FIG. 1. FIG. 3B is a cross-sectional diagram along the line B-B in FIG. 1.

It should be noted that the infrared thermopile sensor 200 of the disclosure may be used in the wearable device (for example, watch). The infrared thermopile sensor 200 of the disclosure may have a silicon cover. The micro structure of the silicon cover may reduce the thermal effect of the package structure. The silicon cover has a higher thermal conductivity coefficient (for example, about 148 W/m/K), thereby the silicon cover has better thermal conductivity and temperature uniformity. As a result, the differences between the thermal radiation of the package structure received by the duo-thermopile sensing elements may be minimized.

Referring to FIG. 1, FIG. 2, FIG. 3A, and FIG. 3B, the infrared thermopile sensor 200 of the disclosure includes an infrared sensing chip 300, a silicon cover 400, a microcontroller chip 500, a package substrate 600, and a sealing encapsulation 700.

In some embodiments, the infrared sensing chip 300 includes a first substrate 310, a first thermopile sensing element 320, a second thermopile sensing element 330, and a front-end signal processing unit 340. In some embodiments, the first substrate 310 has a wire-bonding pad 311 and two membrane structures (or floating plate structures) 312, 313 formed by a front-side wet etching. The wire-bonding pad 311 and the membrane structures 312, 313 are disposed correspondingly. In some embodiments, the wire-bonding pad 311 is disposed on the edge of the first substrate 310 for wire bonding to the microcontroller chip 500, and the membrane structures 312, 313 are disposed away from the wire-bonding pad 311 and disposed corresponding to the silicon cover 400.

In some embodiments, the first substrate 310 further includes two concave portions 314, 315 corresponding to the membrane structures 312, 313 respectively. In other words, the membrane structure 312 is located above the concave portion 314, and the membrane structure 313 is located above the concave portion 315.

In some embodiments, the first thermopile sensing element 320 is disposed on the membrane structure 312 corresponding to the concave portion 314. A hot junction of the first thermopile sensing element 320 is located on the membrane structure 312, and a cold junction of the first thermopile sensing element 320 is located on the periphery of the concave portion 314. The first thermopile sensing element 320 may sense a temperature of the object 900 and generate a temperature signal. In some embodiments, the temperature of the object 900 is, for example, a wrist temperature, and the body core temperature of human body is obtained by converting the wrist temperature.

In some embodiments, the second thermopile sensing element 330 is disposed on the membrane structure 313 corresponding to the concave portion 315. The second thermopile sensing element 330 is disposed adjacent to the first thermopile sensing element 320. A hot junction of the second thermopile sensing element 330 is located on the membrane structure 313, and a cold junction of the second thermopile sensing element 330 is located on the periphery of the concave portion 315. The window portion of the second thermopile sensing element 330 is shielded, thereby the second thermopile sensing element 330 may merely sense the thermal radiation of the silicon cover 400 to generate a compensation temperature signal.

In some embodiments, the front-end signal processing unit 340 is disposed on the first substrate 310 and electrically connected with the first thermopile sensing element 320 and the second thermopile sensing element 330.

Figure 4:
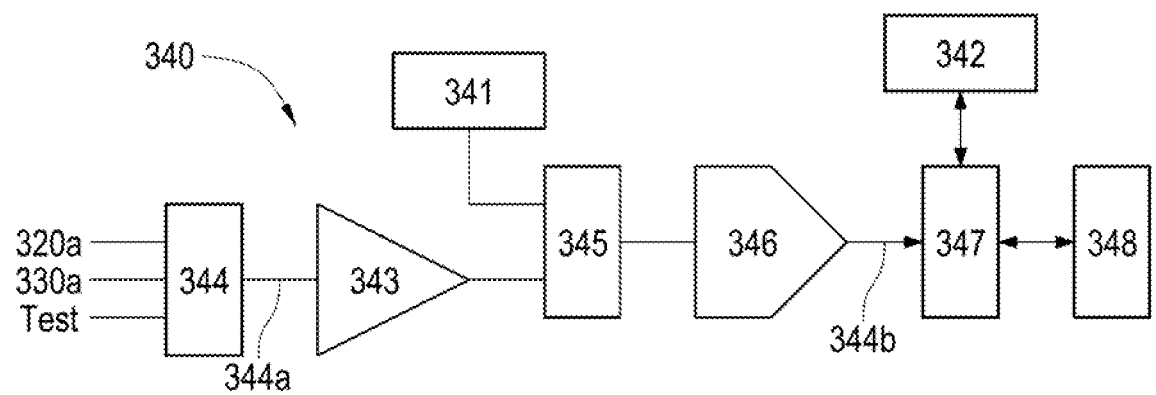
FIG. 4 is a block diagram of the front-end signal processing unit of the infrared thermopile sensor, in accordance with some embodiments of the disclosure.

FIG. 4 is a block diagram of the front-end signal processing unit of the infrared thermopile sensor, in accordance with some embodiments of the disclosure. As shown in FIG. 4, in some embodiments, the front-end signal processing unit 340 at least includes an ambient temperature sensing element 341 and a non-volatile memory 342. During the calibration phase, the ambient temperature sensing element 341 may generate a calibrated ambient temperature information. In other words, ambient temperature sensing element 341 may generate an ambient temperature that is calibrated by on-chip non-volatile memory information. During the ambient temperature calibration phase, the analog signal of ambient temperature sensing element 341 is converted into a digital signal by an analog-to-digital converter (ADC) 346, then the digital signal 344b is transmitted to the microcontroller chip 500 through a communication interface 348. The digital signal is computed by the microcontroller chip 500 to calculate the calibration parameter and then store back to the non-volatile memory 342 through the communication interface 348.

In some embodiments, the ambient temperature sensing element 341 includes at least one thermal sensitive diode that is sensitive to temperature change, such as, but not limited to, a Schottky diode. In some embodiments, the ambient temperature sensing element 341 may be configured by a plurality of Schottky diodes connected in series.

In some embodiments, the front-end signal processing unit 340 may further include a low-noise low-offset amplifier 343, a plurality of signal selection multiplexers 344, 345, an ADC 346, a register 347, and a communication interface 348. The elements are electrically connected with the ambient temperature sensing element 341 and the non-volatile memory 342, respectively.

In some embodiments, the signal selection multiplexer 344 makes a selection based on the temperature signal 320a of the first thermopile sensing element 320, the compensation temperature signal 330a of the second thermopile sensing element 330, and a self-testing signal Test, and generates an output signal 344a to the low-noise low-offset amplifier 343. The low-noise low-offset amplifier 343 amplifies the output signal 344a and outputs that to the signal selection multiplexer 345.

The signal selection multiplexer 345 may select the ambient temperature sensing element 341 or amplified output signal 344a, and then output to the ADC 346 for analog to digital conversion. In some embodiments, the ADC 346 may be, for example, a sigma-delta converter. The converted digital signal 344b is outputted to the register 347, and is further outputted to the microcontroller chip 500 through the communication interface 348.

It is worth mentioning that when the probe testing is performed to the infrared sensing chip 300, the ambient temperature sensing element 341 may be calibrated simultaneously. The ambient temperature parameters of the ambient temperature sensor 341 may be stored in the non-volatile memory 342 through the register 347 and the communication interface 348. When the microcontroller chip 500 is powered up, the microcontroller chip 500 may read the ambient temperature parameters of the ambient temperature sensing element 341 stored in the non-volatile memory 342 through the register 347 and the communication interface 348. The microcontroller chip 500 may calculate and obtain the ambient temperature information according to the ambient temperature parameters. Thus, the microcontroller chip 500 may compute to obtain a temperature adjustment information on a predetermined temperature according to the ambient temperature information and a water vapor pressure information. The microcontroller chip 500 further calculates the temperature of the object 900 according to the digit signal 344b and the temperature adjustment information. The specific computation manner of the microcontroller chip 500 is described as below.

Figure 5:
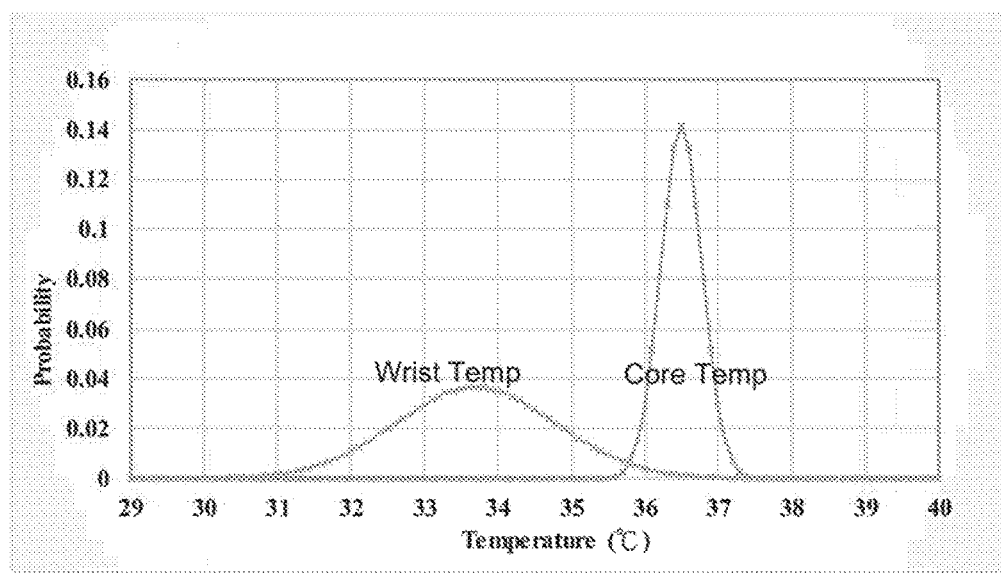
FIG. 5 is a distribution curve diagram of the body core temperature and the wrist temperature at room temperature.
Figure 6:
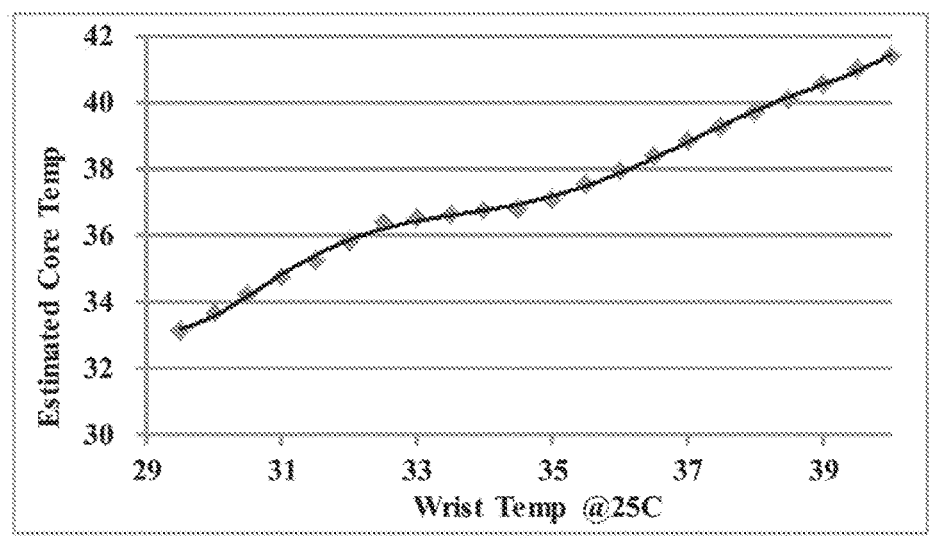
FIG. 6 is a curve diagram of nonlinear mapping from wrist temperature to body core temperature.
Figure 7:
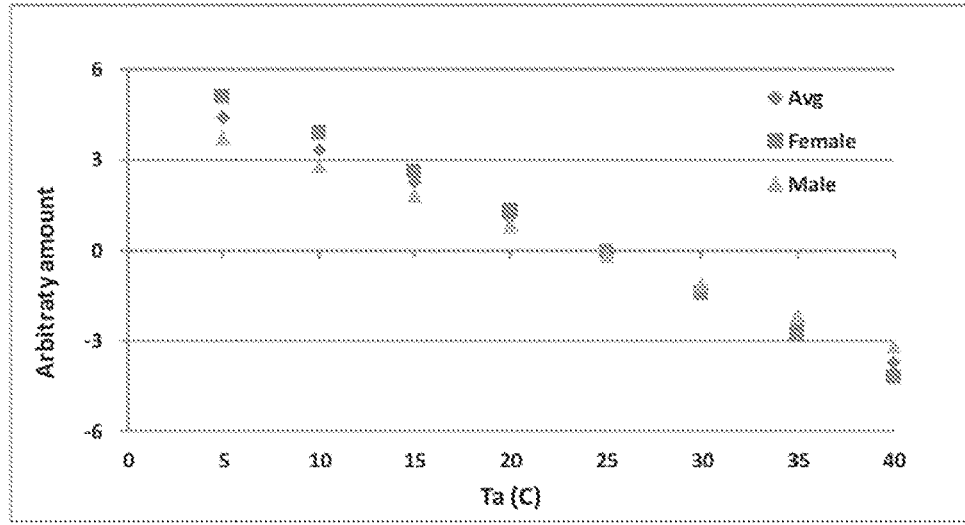
FIG. 7 is a distribution diagram of the correction amount of the wrist temperature at various air temperature corresponding to different genders.

FIG. 5 is a distribution curve diagram of the body core temperature and the wrist temperature at room temperature. FIG. 6 is a curve diagram of nonlinear mapping from wrist temperature to body core temperature. FIG. 7 is a distribution diagram of the correction amount of the wrist temperature at various air temperature corresponding to different genders.

In some embodiments, in order to obtain the body core temperature (that is, the second temperature) based on the wrist temperature (that is, the first temperature), the influences from the air temperature, humidity and skin temperature variance effect, etc., need to be eliminated through some calculations. FIG. 5 shows the average result from 1000 persons data at room temperature (for example, 25° C.). The average value of the wrist temperature is, for example, about 33.7° C., and the standard deviation is, for example, about 1.18° C. Specifically, the average value of the wrist temperature is lower than the average value of the body core temperature, and the standard deviation range of the wrist temperature is greater than the standard deviation range of the body core temperature. Therefore, the body core temperature is unable to be estimated by directly shifting the wrist temperature.

FIG. 6 shows the nonlinear curve mapping from the wrist temperature at room temperature (for example, 25° C.) to the body core temperature. For example, that may be approximated by a 6th order polynomial function as equation (1).

$$T_{core}=a1 \times Tw^6+a2 \times Tw^5+a3 \times Tw^4+a4 \times Tw^3+a5 \times Tw^2+a6 \times Tw+a7 \qquad (1)$$

$T_{core}$ is the body core temperature. Tw is the normalized wrist temperature at 25° C. a1 to a7 are the parameters generated from experiment data. 25° C. is the predetermined temperature. Here is not intended to be limiting.

As described above, the wrist temperature is not fixed value for the same object (that is, the user) at various environmental conditions (for example, air temperature, humidity level, clothing, etc.). Specifically, the wrist (or skin) temperature is dependent on several factors such as air temperature, water vapor pressure, metabolic rate, air speed, body core temperature, genders and clothing conditions. On the other hand, the wearable device may not be unable to obtain all of the information. Therefore, in some embodiments, three major parameters, for example, air temperature, water vapor pressure and gender, may be used as the correction factors for the wrist temperature. For example, the wrist temperature at different air temperature may be adjusted to the wrist temperature at 25° C. (that is, the predetermined temperature) by equation (2).

$$T_{wrist\_adj}=b1 \times Ta^2+b2 \times Ta+c1 \times Wp^2+c2 \times Wp+c3 \qquad (2)$$

$T_{wrist\_adj}$ is the adjusted amount (that is, the temperature adjustment information) of the wrist temperature adjusted from the current room temperature to the temperature of 25° C. Ta is the current air temperature with unit in ° C. Wp is water vapor pressure at air temperature Ta. b1, b2, c1, c2 and c3 are the parameters generated from the experiment.

It should be noted that there may be an offset between the ambient temperature information and an air temperature of an external environment. In other words, the ambient temperature information is the temperature around the sensing element inside the wearable device, thereby the ambient temperature information is not the exact air temperature of the external environment. The offset may be obtained from experiment and changed with the air temperature of the external environment. The microcontroller chip 500 may calculate the air temperature Ta of the external environment according to the ambient temperature information T ambient and the offset $T_{offset}$ as equation (3). $T_{offset}$ might be a function with Ta or a fixed constant.

$$Ta=T_{ambient}+T_{offset} \qquad (3)$$

In some embodiments, the gender information may also need to be considered, that is, $T_{wrist\_adj}$ may be related to gender. Moreover, the water vapor pressure may be obtained according to the saturated water vapor pressure and relative humidity at the current air temperature Ta to be used in equation (2). In some embodiments, the predetermined water vapor pressure may be estimated by using the relative humidity of 60%~70% (for example, the relative humidity of 64%) at room temperature.

The relation between the saturated water vapor pressure and room temperature at 5° C. to 45° C. may be described as equation (4)

$$W_{ps}=-3 \times 10^{-5} \times Ta^3+0.0041 \times Ta^2-0.0319 \times Ta+0.6482 \qquad (4)$$

$W_{ps}$ is saturated water vapor pressure with unit in kPa.
Under fixed relative humidity, the $T_{wrist\_adj}$ in equation (2) may be simplified as equation (5).

$$T_{wrist\_adj}=b4 \times Ta^2+b5 \times Ta+b6 \qquad (5)$$

b4, b5 and b6 are the parameters under fixed relative humidity (for example, the relative humidity of 64%).

Further, as described above, $T_{wrist\_adj}$ may be related to gender. FIG. 7 shows the adjusted amount of the wrist temperature corresponding to gender at different air temperature and relative humidity of 64%. Specifically, the adjusted amount of $T_{wrist\_adj}$ corresponding to gender may be approximated as equation (6).

$$T_{wrist\_adj\_sex\_gender}=d1 \times Ta^2+d2 \times Ta+d3 \qquad (6)$$

$T_{wrist\_adj\_sex\_gender}$ is the adjusted amount (that is, the temperature adjustment information being adjusted corresponding to gender) corresponding to gender. d1 to d3 are the parameters for the adjusted amount of the wrist temperature corresponding to different genders. The water vapor pressure is included in the adjusted amount (as equation (5)) because the relative humidity is defined as 64%. In some embodiments, if the gender is unknown, d1 to d3 may be obtained by using average value. In some embodiments, the gender information may be obtained through the configuration of the wearable device (for example, watch) and transmitted to the infrared thermopile sensor 200 (as shown in FIG. 2) to be stored in the non-volatile memory 342 (as shown in FIG. 4).

Moreover, the standard deviations of the wrist temperature may be different from the condition of predetermined temperature (for example, 25° C.). A standard deviation correction factor may be introduced in the normalized wrist temperature to body core temperature conversion curve. That is, different wrist temperature to body core temperature conversion curve is used for various air temperature.

In summary, please refer to FIG. 2, FIG. 4 to FIG. 7, the computation process of the microcontroller chip 500 obtaining the body core temperature from the wrist temperature is as below. In the Step 1, the ambient temperature sensing element 341 detects the ambient temperature information. There may be an offset between the ambient temperature information and the air temperature of an external environment. The offset may be obtained from experiment and changed with the air temperature of the external environment. The microcontroller chip 500 may calculate the air temperature Ta (for example, the current room temperature) of the external environment according to the ambient temperature information and the offset as equation (3).

In the Step 2, the fixed (or known) relative humidity and known gender is used to calculate the adjusted amount $T_{wrist\_adj\_sex\_gender}$ of the wrist temperature according to equation (6). In the Step 3, the normalized wrist temperature at 25° C. is obtained according to equation (7).

$$Tw = T_{wrist\_measure} + T_{wrist\_adj\_sex\_gender} \quad (7)$$

Tw is the normalized wrist temperature at 25° C. $T_{wrist\_measure}$ is the wrist temperature measured (that is, the digital signal 344b digitalized from the temperature signal and compensation temperature signal) sensed by the infrared thermopile sensor. It should be noted that if the gender information is not included, the normalized wrist temperature Tw at 25° C. may be obtained according the adjusted amount $T_{wrist\_adj}$ from equation (5).

In the Step 4, the normalized wrist temperature Tw is used to obtain the body core temperature according to equation (1). In other words, the microcontroller chip 500 may convert the first temperature (that is, the wrist temperature) to the second temperature (that is, the body core temperature) of the object (that is, the user) according to a conversion curve.

It is worth mentioning that, in some embodiments, if the standard deviation of the wrist temperature is different from the condition in 25° C., the standard deviation correction factor may also be implemented to the computation of converting the wrist temperature to the body core temperature. In other words, the computation of converting the wrist temperature to the body core temperature may be different at different air temperature.

Referring to FIG. 1, FIG. 2, FIG. 3A, and FIG. 3B, the silicon cover 400 is connected with the infrared sensing chip 300 by a wafer-level bonding. The silicon cover 400 includes an infrared Fresnel lens 410. The infrared Fresnel lens 410 is used for focusing a thermal radiation 910 of the object 900 to the first thermopile sensing element 320. The size of the silicon cover 400 is smaller than the size of the infrared sensing chip 300. The wire-bonding pad 311 of the infrared sensing chip 300 is exposed from the silicon cover 400. In some embodiments, the infrared Fresnel lens 410 of the silicon cover 400 may be manufactured by a semiconductor process. It is worth mentioning that a diameter of the first thermopile sensing element 320 is about 400 µm and a focal length of the lens needs to be about 200 µm, and the focal length is difficult to be achieved by a traditional convex lens. Therefore, the disclosure uses the infrared Fresnel lens 410 manufactured by the semiconductor process to achieve the requirement.

Figure 8A:
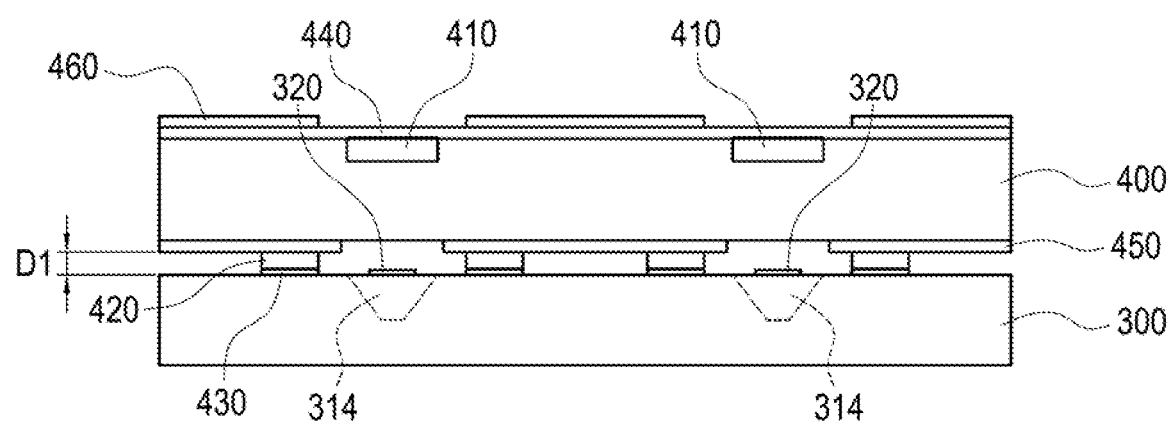
FIG. 8A is a schematic diagram of the silicon cover and the infrared sensing chip being wafer-level bonded, in accordance with some embodiments of the disclosure.
Figure 8B:
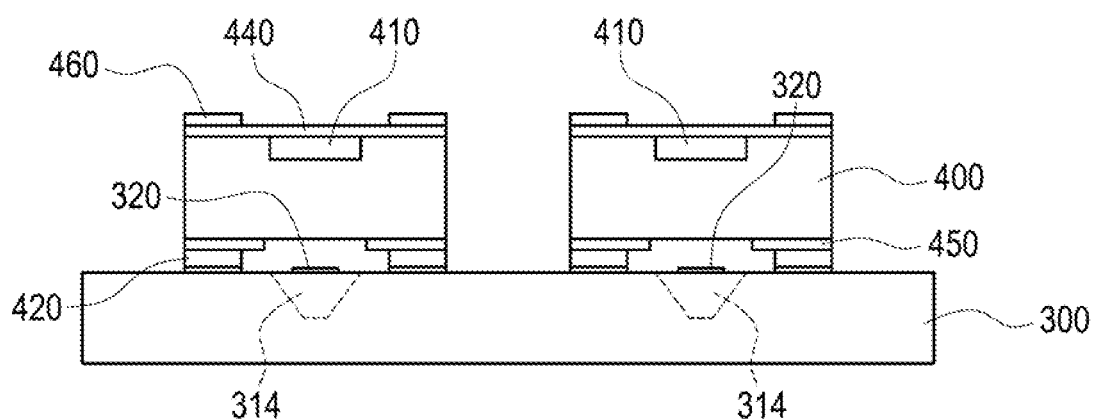
FIG. 8B is a schematic diagram of the silicon cover being diced.

FIG. 8A is a schematic diagram of the silicon cover and the infrared sensing chip being wafer-level bonded, in accordance with some embodiments of the disclosure. FIG. 8B is a schematic diagram of the silicon cover being diced. As shown in FIG. 8A, in some embodiments, the silicon cover 400 and the infrared sensing chip 300 may be connected with each other by the wafer-level bonding with a photoresist layer (photoresist standoff layer) 420 and an adhesive 430. The photoresist layer 420 may be used as a standoff. A thickness of the photoresist layer 420 is greater than or equal to about 40 µm and less than or equal to about 100 µm. In other words, the silicon cover 400, for example, may use the photoresist layer 420 (such as SU-8 photoresist) to elevate a distance with the infrared sensing chip 300 therebetween to at least about 40 µm. In some embodiments, the distance D1 between the silicon cover 400 and the infrared sensing chip 300 may be about 100 µm. Thus, the effect from the gas heat conduction in the silicon cover 400 that might reduce the sensitivity of first thermopile sensing element 320 is reduced.

In some embodiments, the silicon cover 400 may further include an anti-reflection coating 440, a third metal layer 450, and a fourth metal layer 460. The anti-reflection coating 440 is disposed on the infrared Fresnel lens 410 to increase the transmission efficiency of the infrared Fresnel lens 410. The third metal layer 450 is disposed on a lower surface of the silicon cover 400 corresponding to the second thermopile sensing element 330 for shielding the second thermopile sensing element 330 from incidence of the thermal radiation of the object. The fourth metal layer 460 is disposed on the upper surface of the silicon cover 400 corresponding to the second thermopile sensing element 330. The opening window allows the incidence of external thermal radiation to the first thermopile sensing element 320 and prevents the oblique light from entering the second thermopile sensing element 330. In some embodiments, the fourth metal layer 460 may not be disposed on the upper surface of the silicon cover 400. As shown in FIG. 8B, after the silicon cover 400 is diced, the third metal layer 450 disposed on the lower surface of the silicon cover 400 may prevent the oblique light from entering the second thermopile sensing element (dummy unit) 330 by the infrared Fresnel lens 410. The third metal layer 450 is disposed on top of second thermopile sensor 330 to block the thermal radiation input from the object.

Figure 9A:
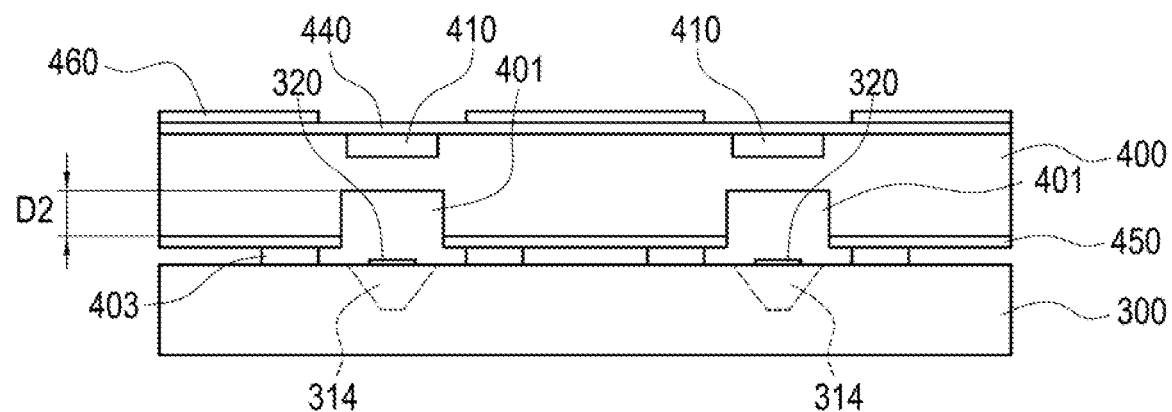
FIG. 9A is a schematic diagram of the silicon cover and the infrared sensing chip being wafer-level bonded, in accordance with some other embodiments of the disclosure.
Figure 9B:
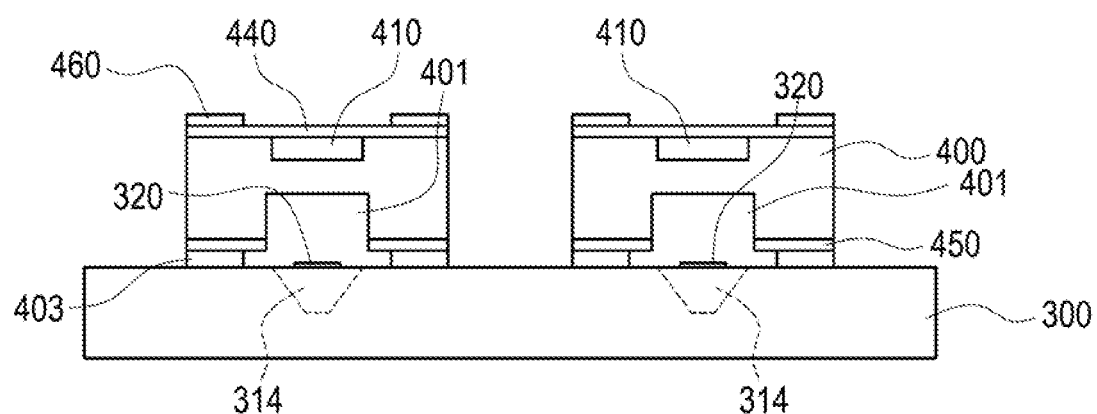
FIG. 9B is a schematic diagram of the silicon cover being diced.

FIG. 9A is a schematic diagram of the silicon cover and the infrared sensing chip using wafer-level bonded, in accordance with some other embodiments of the disclosure. FIG. 9B is a schematic diagram of the silicon cover being diced. As shown in FIG. 9A, in some embodiments, the silicon cover 400 may include a first cavity 401 and a second cavity 402 (referring to FIG. 3B) corresponding to the first thermopile sensing element 320 and the second thermopile sensing element 330, respectively. The silicon cover 400 and the infrared sensing chip 300 are connected with each other by the wafer-level bonding with a eutectic bonding or a solder bonding.

In some embodiments, a silicon deep reactive-ion etching (RIE) may be used to form the first cavity 401 and the second cavity 402 on the silicon cover 400 corresponding to the first thermopile sensing element 320 and the second thermopile sensing element 330, respectively. A depth D2 of the first cavity 401 and a depth of the second cavity 402 may be respectively greater than or equal to about 40 µm and less than or equal to about 100 µm. In some embodiments, the depth D2 of the first cavity 401 and the depth of the second cavity 402 may be about 100 µm, here is not intended to be limiting. It is worth mentioning that when the silicon cover 400 and the infrared sensing chip 300 are under the process of the wafer-level bonding, the first cavity 401 and the second cavity 402 may seal the first thermopile sensing element 320 and the second thermopile sensing element 330, respectively by a vacuum encapsulation to increase the sensitivity of the sensing elements. Further, the silicon cover 400 may be connected with the infrared sensing chip 300 by the eutectic bonding or the solder bonding with a metal bump (weld leg) 403. As shown in FIG. 9B, after the silicon cover 400 is diced, the fourth metal layer 460 disposed on the upper surface of the silicon cover 400 may prevent the oblique light from entering the second thermopile sensing element (dummy unit) 330 by the infrared Fresnel lens 410. Moreover, the third metal layer 450 may similarly be disposed on the lower surface of the silicon cover 400 to shield the incidence of external thermal radiation to the first thermopile sensing element 320 and prevents the oblique light from entering the second thermopile sensing element 330. Similarly, the third metal layer 450 may not be disposed on the lower surface of the silicon cover 400.

When the silicon cover 400 utilizes the cavity structure and is connected with the infrared sensing chip 300 by vacuum wafer-level bonding, the infrared sensing chip 300 may utilize a silicon on insulator (SOI) chip. A depth (formation depth) of an oxide insulating layer in the SOI chip may be greater than about 2 µm. In some embodiments, the depth may be about 10 µm. That may be used to decrease the thickness of the infrared sensing chip 300 and further reduce the whole height of the infrared thermopile sensor 200 to less than about 1 mm.

Specifically, when the silicon cover 400 is too close with the membrane structures 312, 313 where the first thermopile sensing element 320 and the second thermopile sensing element 330 are disposed, the gas heat conduction may cause heat loss for the sensing elements and further decrease the sensitivity. Therefore, the first cavity 401 and the second cavity 402 may be disposed on the silicon cover 400 to increase the distance between the silicon cover 400 and the membrane structures 312, 313. On the other hand, as shown in FIG. 8A and FIG. 8B, when the photoresist layer 420 is used to increase the distance between the silicon cover 400 and the membrane structures 312, 313, the cavity may not need to be disposed on the silicon cover 400.

Referring back to FIG. 1, FIG. 2, FIG. 3A, and FIG. 3B, in some embodiments, a length of the edge 404 of the silicon cover 400 is less than a length of the edge 301 of the infrared sensing chip 300 in about 200 µm to about 400 µm. Thus, when the silicon cover 400 is combined and diced with the infrared sensing chip 300, the wire-bonding pad 311 of the infrared sensing chip 300 is exposed from the silicon cover 400.

In some embodiments, the microcontroller chip 500 is connected with the infrared sensing chip 300. The microcontroller chip 500 receives the temperature signal and compensation temperature signal being digitalized by the front-end signal processing unit 340 (i.e., digital signal 344b) and the ambient temperature information. The microcontroller chip 500 computes to obtain a temperature adjustment information relative to a predetermined temperature according to an air temperature and a water vapor pressure information. The microcontroller chip 500 calculate a first temperature of the object 900 according to the temperature signal, the compensation temperature signal and the temperature adjustment information. In some embodiments, the microcontroller chip 500 includes a second substrate 510 and a first metal layer 520. The infrared sensing chip 300 and the microcontroller chip 500 are glued together by a die attach film (DAF) 530.

The temperature of the microcontroller chip 500 is relatively high during working, and the surface of the microcontroller chip 500 may generate thermal radiation to be received by the sensing elements of the infrared sensing chip 300, and the accuracy of measuring temperature may be influenced. Thus, the first metal layer 520 with a metal material of low emissivity may be disposed on the upper surface of the second substrate 510 to reduce the thermal disturbance from the microcontroller chip 500 to the infrared sensing chip 300. In some embodiments, the first metal layer 520 is disposed as the uppermost metal layer of the microcontroller chip 500. The metal material of the first metal layer 520 may include an aluminum.

It should be noted that, in some other embodiments, the first substrate 310 of the infrared sensing chip 300 may also include a second metal layer 350 disposed on the lower surface of the first substrate 310. In other words, the first metal layer 520 and the second metal layer 350 used for isolating the thermal radiation may be simultaneously disposed on the upper surface of the microcontroller chip 500 and the lower surface of the infrared sensing chip 300, respectively. The first metal layer 520 and the second metal layer 350 are spaced with the DAF 530, which is non-conductive in heat. Thus, the heat shielding function may be improved. Specifically, when the first metal layer 520 and the second metal layer 350 are used simultaneously, the first metal layer 520 with low emissivity may reduce the influence of the thermal radiation from the microcontroller chip 500. Further, the DAF 530 is the non-conductive layer for heat, and the thermal resistance from the microcontroller chip 500 to the infrared sensing chip 300 may be increased. The second metal layer 350 under the infrared sensing chip 300 may further block the secondary thermal radiation from the first metal layer 520 of the microcontroller chip 500.

In some embodiments, one side of the microcontroller chip 500 may have a wire-bonding pad 540 for connecting with the infrared sensing chip 300 by wire bonding. The other sides of the microcontroller chip 500 may utilize a plurality of through silicon vias (TSVs) 550 disposed in the second substrate 510 for electrically connecting with the package substrate 600.

In some embodiments, the package substrate 600 carries the microcontroller chip 500 and receives an output signal or an input signal of the microcontroller chip 500 through the TSVs 550. The package substrate 600 may include a plurality of through hole vias 610 (FIG. 2 shows via pad) and a plurality of contacts 620 on the lower surface of the package substrate 600. The TSVs 550 of the microcontroller chip 500 are electrically connected with the vias 610 and the contacts 620 of the package substrate 600. In some embodiments, the package substrate 600 and the microcontroller chip 500 may be connected by the solder paste 630. Therefore, the package substrate 600 may re-route the signal of the microcontroller chip 500 to the contacts 620 on the lower surface through the vias 610. The contacts 620 may be formed as the lead of the surface mount component (SMD) package.

In some embodiments, the sealing encapsulation 700 covers the package substrate 600, the microcontroller chip 500, the infrared sensing chip 300, and the silicon cover 400. The upper surface 405 of the silicon cover 400 is exposed from the sealing encapsulation 700.

Referring to FIG. 3A, and FIG. 3B, the first thermopile sensing element 320 is the active unit and receives the thermal radiation 910 of the object 900 through the infrared Fresnel lens 410 on the silicon cover 400. The second thermopile sensing element 330 is the compensation unit (dummy unit) and is shielded by the fourth metal layer 460 of the silicon cover 400. Thus, the second thermopile sensing element 330 may merely accept the thermal radiation in the second cavity 402 of the silicon cover 400. The first thermopile sensing element 320 and the second thermopile sensing element 330 are symmetrical in structure, and the material of the silicon cover 400 has preferable thermal conductivity, thereby the second thermopile sensing element 330 may be used to compensate for the thermal radiation of the silicon cover 400 for further accurately measuring the temperature.

In some embodiments, the second thermopile sensing element 330 and the first thermopile sensing element 320 are series-opposing connection. Thus, the first temperature of the object 900 may be calculated by directly subtracting the compensation temperature signal of the second thermopile sensing element 330 from the temperature signal of the first thermopile sensing element 320 and then calculating the first temperature of the object 900 using the temperature signal, compensation temperature signal and the ambient temperature information.

In some other embodiments, when there is a difference in sensitivity between the first thermopile sensing element 320 and the second thermopile sensing element 330, and directly subtracting the compensation temperature signal of the second thermopile sensing element 330 is still unable to compensate the thermal radiation of the silicon cover 400, the compensation temperature signal of the second thermopile sensing element 330 may multiply a first parameter Ktp, and then is subtracted from the temperature signal. The step of acquiring the first parameter Ktp is as below:

VTP1 is defined as the numerical value of the temperature signal received by the first thermopile sensing element 320, VTP2 is defined as the numerical value of the compensation temperature signal received by the second thermopile sensing element 330, and the compensated thermal sensing output Vdet is:

$$V\ det = VTP1 - Ktp \times VTP2$$

In other words, the first parameter Ktp is the parameter when the first thermopile sensing element 320 is shielded from the thermal radiation input and the output Vdet is zero, which is Ktp=VTP2/VTP1.

In summary, the infrared thermopile sensor 200 of the disclosure integrates the infrared Fresnel lens 410 to modify the viewing angle of the first thermopile sensing element 320 (active unit). Further, the infrared thermopile sensor of the disclosure uses the micro structure of the silicon cover 400 may reduce the thermal effect of the package structure. The silicon cover 400 has a higher thermal conductivity coefficient (for example, about 148 W/m/K), thereby the silicon cover has better thermal conductivity and temperature uniformity. As a result, the differences between the thermal radiation of the package structure accepted by the duo-thermopile sensing elements 320, 330 may be minimized.

In summary, the infrared thermopile sensor of the disclosure uses the stacked 3D package to reduce the volume, such as about 2×2×1.0 mm³. Further, the infrared thermopile sensor includes a silicon cover with a lens using to confine the viewing angle to less than 30 degrees (in some embodiments, less than 45 degrees), an infrared sensing chip having duo-thermopile sensing elements, and a microcontroller chip for calculating the object temperature (that is, the wrist temperature). One of the thermopile sensing elements is the active unit for measuring the object temperature, and another one of the thermopile sensing elements is the compensation unit (dummy unit) for compensating the influence of the package structure. The top surface of microcontroller is a low emissivity metal layer to reduce the thermal disturbance of microcontroller to the thermopile sensing elements. Thus, the infrared thermopile sensor of the disclosure may accurately measure the temperature under the acute change of ambient temperature.

Furthermore, the non-contact type infrared thermopile sensor of the disclosure may be used in the wearable device (such as watch) and operated at wide ambient temperature range for wrist temperature to body core temperature conversion. By using the detected air temperature, and the wrist temperature detected from the infrared thermopile sensor, the preset or imported water vapor pressure information and gender information from watch installation, the compensated wrist temperature may be computed and used to perform nonlinear wrist temperature to body core temperature conversion.

Moreover, the standard deviations of the wrist temperature may be different from the condition of predetermined temperature (for example, 25° C.). A standard deviation correction factor may be introduced in the normalized wrist temperature to body core temperature conversion curve. That is, different wrist temperature to body core temperature conversion curve is used for various air temperature.

The scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An infrared thermopile sensor, comprising:
   an infrared sensing chip, comprising:
   a first substrate, comprising a wire-bonding pad and two membrane structures configured by a front-side wet etching;
   a first thermopile sensing element, disposed on one of the membrane structures and generating a temperature signal;
   a second thermopile sensing element, disposed on another one of the membrane structures and adjacent to the first thermopile sensing element, and generating a compensation temperature signal; and a front-end signal processing unit, disposed on the first substrate and electrically connected with the first thermopile sensing element and the second thermopile sensing element, the front-end signal processing unit comprising:

an ambient temperature sensing element, generating an ambient temperature information; and a non-volatile memory, configured to store the ambient temperature information; a silicon cover, bonded to the infrared sensing chip by a wafer-level bonding, and comprising an infrared Fresnel lens focusing a thermal radiation of an object to the first thermopile sensing element, a size of the silicon cover being smaller than a size of the infrared sensing chip, and the wire-bonding pad exposed from the silicon cover;

a microcontroller chip, connected with the infrared sensing chip, and configured to receive the temperature signal, the compensation temperature signal and the ambient temperature information, and to compute to obtain a temperature adjustment information relative to a predetermined temperature according to an air temperature the ambient temperature information and a water vapor pressure information, to calculate a first temperature of the object according to the temperature signal, the compensation temperature signal and the temperature adjustment information, and to calculate a second temperature of the object according to the first temperature, wherein the water vapor pressure information is preset or imported, the microcontroller chip comprising:

a second substrate; and a first metal layer, disposed on an upper surface of the second substrate and comprising a metal material with a low emissivity to reduce thermal disturbance from the microcontroller chip to the infrared sensing chip; and a plurality of through silicon vias (TSVs), disposed in the second substrate;

a package substrate, configured to carry the microcontroller chip and to receive an output signal or an input signal of the microcontroller chip through the TSVs, and comprising a plurality of contacts disposed on a lower surface thereof, and the TSVs electrically connected to the contacts; and a sealing encapsulation, configured to cover the package substrate, the microcontroller chip, the infrared sensing chip, and the silicon cover, and an upper surface of the silicon cover being exposed from the sealing encapsulation.

2. The infrared thermopile sensor in claim 1, wherein the microcontroller chip is configured to calculate the first temperature according to the ambient temperature information after subtracting the compensation temperature signal from the temperature signal.

3. The infrared thermopile sensor in claim 2, wherein the microcontroller chip is configured to calculate the first temperature according to the ambient temperature information after subtracting the compensation temperature signal multiplied with a first parameter from the temperature signal, and Ktp=VTP2/VTP1, Ktp is the first parameter, VTP1 is the temperature signal received by the first thermopile sensing element, and VTP2 is the compensation temperature signal received by the second thermopile sensing element.

4. The infrared thermopile sensor in claim 1, wherein the infrared sensing chip and the microcontroller chip are glued together by a die attach film (DAF).

5. The infrared thermopile sensor in claim 1, wherein the first substrate comprises a second metal layer disposed on a lower surface thereof.

6. The infrared thermopile sensor in claim 1, wherein the front-end signal processing unit further comprises a signal selection multiplexer and a communication interface electrically connected with the ambient temperature sensing element and the non-volatile memory.

7. The infrared thermopile sensor in claim 1, wherein the ambient temperature sensing element comprises at least one thermal sensitive diode.

8. The infrared thermopile sensor in claim 1, wherein the silicon cover comprises a first cavity and a second cavity corresponding to the first thermopile sensing element and the second thermopile sensing element respectively, and the silicon cover and the infrared sensing chip are bonded together by the wafer-level bonding with a eutectic bonding or a solder bonding.

9. The infrared thermopile sensor in claim 8, wherein when the silicon cover and the infrared sensing chip are bonded together, the first cavity and the second cavity seal the first thermopile sensing element and the second thermopile sensing element respectively by a vacuum encapsulation.

10. The infrared thermopile sensor in claim 8, wherein a depth of the first cavity is greater than or equal to about 40 μm and less than or equal to about 100 μm.

11. The infrared thermopile sensor in claim 1, wherein the silicon cover comprises a fourth metal layer disposed on the upper surface thereof corresponding to the second thermopile sensing element.

12. The infrared thermopile sensor in claim 1, wherein the metal material of the first metal layer comprises an aluminum.

13. The infrared thermopile sensor in claim 1, wherein the infrared sensing chip is a silicon on insulator (SOI) chip, and a packaging height of the infrared thermopile sensor is less than 1 mm.

14. The infrared thermopile sensor in claim 13, wherein a depth of an oxide insulating layer in the SOI chip is greater than about 2 μm.

15. The infrared thermopile sensor in claim 1, wherein an offset, which is obtained from experiment, is between the ambient temperature information generated by the ambient temperature sensing element and an air temperature of an external environment, the microcontroller chip is configured to calculate the air temperature according to the ambient temperature information and the offset.

16. The infrared thermopile sensor in claim 1, wherein the microcontroller chip is configured to convert the first temperature to the second temperature according to a conversion curve.

17. The infrared thermopile sensor in claim 16, wherein the microcontroller is configured to use different conversion curves for the first temperature to the second temperature based on different standard deviations of the first temperature corresponding to the air temperature.

18. The infrared thermopile sensor in claim 1, wherein the first temperature is a wrist temperature.

19. The infrared thermopile sensor in claim 1, wherein the microcontroller chip is configured to further compute to obtain the temperature adjustment information relative to the predetermined temperature according to the air temperature, the water vapor pressure information and a gender information.

\* \* \* \* \*